US006146915A

United States Patent [19]

Pidwerbecki et al.

[11] Patent Number: 6,146,915

[45] Date of Patent: Nov. 14, 2000

[54] REDUCED SIZE PRINTHEAD FOR AN INKJET PRINTER

[75] Inventors: David Pidwerbecki, Corvallis, Oreg.; Cheryl A. MacLeod, Ramana, Calif.; Patrick V. Boyd, Albany, Oreg.; Vladek P. Kasperchik, Corvallis, Oreg.; Gerald T. Kraus, Albany, Oreg.

[73] Assignee: Hewlett-Packard Company, Palo Alto, Calif.

[21] Appl. No.: 09/433,700

[22] Filed: Nov. 3, 1999

Related U.S. Application Data

[62] Division of application No. 08/920,478, Aug. 29, 1997.

[51] Int. Cl.[7] .................... H01L 21/00

[52] U.S. Cl. .................... 438/21; 346/1.1; 346/140 R; 205/75

[58] Field of Search .................... 438/21; 346/1.1, 346/140 R; 205/75

[56] References Cited

U.S. PATENT DOCUMENTS

| | | | |
|---|---|---|---|
| 4,374,707 | 2/1983 | Pollack | 204/11 |
| 4,460,906 | 7/1984 | Kanayama | 346/140 R |
| 4,528,577 | 7/1985 | Cloutier et al. | 346/140 R |
| 4,716,423 | 12/1987 | Chan et al. | 346/140 R |
| 4,827,287 | 5/1989 | Braun et al. | 346/75 |
| 4,829,319 | 5/1989 | Chan et al. | 346/1.1 |
| 4,971,665 | 11/1990 | Sexton | 204/11 |
| 5,167,776 | 12/1992 | Bhaskar et al. | 205/75 |
| 5,194,877 | 3/1993 | Lam et al. | 346/1.1 |
| 5,236,572 | 8/1993 | Lam et al. | 205/75 |
| 5,255,017 | 10/1993 | Lam | 346/140 R |
| 5,506,608 | 4/1996 | Marler et al. | 347/18 |
| 5,610,637 | 3/1997 | Sikiya et al. | 347/10 |
| 5,646,662 | 7/1997 | Kitahara | 347/70 |
| 5,718,044 | 2/1998 | Baughman et al. | 29/890.1 |

FOREIGN PATENT DOCUMENTS

| | | | |
|---|---|---|---|
| 0317171 | 5/1989 | European Pat. Off. | B41J 3/04 |
| 0495663A2 | 1/1992 | European Pat. Off. | B41J 2/14 |
| 04900061A2 | 6/1992 | European Pat. Off. | C25D 1/08 |
| 0622198A2 | 4/1994 | European Pat. Off. | B41J 2/16 |
| 01128840 | 5/1989 | Japan | B41J 3/04 |
| 4-47947 | 2/1992 | Japan | B41J 2/045 |

OTHER PUBLICATIONS

Siewell, Boucher, McClelland, "The ThinkJet Orifice Plate: A Part With Many functions" Hewlett–Packard Journal, May 2985, pp. 33–37.

Askeland, Chiders, Sperry, "The Second–Generation Thermal InkJet Structure", Hewlett–Packard Journal, Aug. 1988, pp. 28–31.

McClelland, "New Directions in Printhead Construction", IS & T's Eleventh International Congress on Advances in Non–Impact Printing Technologies. Oct. 29–Nov. 3, 1995, Recent Process in InkJet Technologies, pp. 123–124.

*Primary Examiner*—Matthew Smith
*Assistant Examiner*—Renzo N. Rocchegiani

[57] ABSTRACT

A printhead for an inkjet print cartridge capable of generating low drop weight ink drops is produced by reducing the dimensions of the firing chamber. A thinner orifice plate is needed to reliably achieve the lower drop weight ink drops. To overcome the material strength limitations of such a thinner orifice plate, an annealing step in the manufacture of the printhead is employed to modify the material properties of the orifice plate. This improved process improves the print quality of printers and aids in the production handling properties of the orifice plate. Orifice plates having a thickness in the range of 25 μm to 40 μm are being produced.

4 Claims, 6 Drawing Sheets

REDUCED SIZE PRINTHEAD FOR AN INKJET PRINTER

This is a divisional application of co-pending U.S. patent application Ser. No. 08/920,478, filed on Aug. 29, 1997.

BACKGROUND OF THE INVENTION

The present invention is generally related to a printhead for an inkjet printer and more particularly related to a printhead utilizing small dimensions to produce reduced drop weight ink drops.

Inkjet printers operate by expelling a small volume of ink through a plurality of small orifices in an orifice plate held in proximity to a medium upon which printing or marks are to be placed. These orifices are arranged in a fashion in the orifice plate such that the expulsion of drops of ink from a selected number of orifices relative to a particular position of the medium results in the production of a portion of a desired character or image. Controlled repositioning of the orifice plate or the medium followed by another expulsion of ink drops results in the creation of more segments of the desired character or image. Furthermore, inks of various colors may be coupled to individual arrangements of orifices so that selected firing of the orifices can produce a multicolored image by the inkjet printer.

Several mechanisms have been employed to create the force necessary to expel an ink drop from a printhead, among which are thermal, piezoelectric, and electrostatic mechanisms. While the following explanation is made with reference to the thermal ink expulsion mechanism, the present invention may have application for the other ink expulsion mechanisms as well.

Expulsion of the ink drop in a conventional thermal inkjet printer is a result of rapid thermal heating of the ink to a temperature which exceeds the boiling point of the ink solvent to create a vapor phase bubble of ink. Such rapid heating of the ink is generally achieved by passing a pulse of electric current through an ink ejector which is an individually addressable heater resistor, typically for 1 to 3 microseconds, and the heat generated thereby is coupled to a small volume of ink held in an enclosed area associated with the heater resistor and which is generally referred to as a firing chamber. For a printhead, there are a plurality of heater resistors and associated firing chambers perhaps numbering in the hundreds—each of which can be uniquely addressed and caused to eject ink upon command by the printer. The heater resistors are deposited in a semiconductor substrate and are electrically connected to external circuitry by way of metalization deposited on the semiconductor substrate. Further, the heater resistors and metalization may be protected from chemical attack and mechanical abrasion by one or more layers of passivation. Additional description of basic printhead structure may be found in "The Second-Generation Thermal InkJet Structure" by Ronald Askeland et al. in The Hewlett-Packard Journal, August 1988, pp. 28–31. Thus, one of the walls of each firing chamber consists of the semiconductor substrate (and typically one firing resistor). Another of the walls of the firing chamber, disposed opposite the semiconductor substrate in one common implementation, is formed by the orifice plate. Generally, each of the orifices in this orifice plate is arranged in relation to a heater resistor in a manner which enables ink to be expelled from the orifice. As the ink vapor bubble nucleates at the heater resistor and expands, it displaces a volume of ink which forces an equivalent volume of ink out of the orifice for deposition on the medium. The bubble then collapses and the displaced volume of ink is replenished from a larger ink reservoir by way of an ink feed channel in one of the walls of the firing chamber.

As users of inkjet printers have begun to desire finer detail in the printed output from a printer—especially in color output—the technology has been pushed into smaller drops of ink to achieve the finer detail. Smaller ink drops means lowered drop weight and lowered drop volume. Production of such low drop weight ink drops requires smaller structures in the printhead. Thus, smaller firing chambers (containing a smaller volume of ink), smaller firing resistors, and smaller orifice bore diameters are required. It is axiomatic in thermal inkjet printer printheads that the orifice plate thickness be no less than approximately 45 $\mu$m thick. Orifice plates thinner than 45 $\mu$m suffer the serious disadvantage of being too flimsy to handle and likely to break apart in a production environment or become distorted by heat processing of the printhead. Orifice plates are conventionally manufactured by electroforming nickel on a mandrel and subsequently plated with a protective metal layer on the nickel. Conventional wafer handling production equipment cannot maneuver the thin orifice plate for processing in a manufacturing environment. Furthermore, since a multiplicity of orifice plates are produced as one electroform, singulating each orifice plate from the others on the nickel electroform becomes virtually impossible with production equipment when the metal orifice plate is less than 45 $\mu$m thick. Even if the production difficulties with thin, conventionally produced, orifice plates were resolved, the thin orifice plates are too prone to distortion due to stresses when the thin orifice plate is positioned and secured on the barrier layer of the printhead.

Conventionally, an orifice plate for a thermal inkjet printer printhead is formed from a sheet of metal which is perforated with a plurality of small holes leading from one side of the metal sheet to the other. There has also been increased use of a polymer sheet through which holes have been ablated as an orifice plate. In the metal orifice plate example, the process of manufacture has been delineated in the literature. See, for example, Gary L. Siewell et al., "The Thinkjet Orifice Plate: a Part With Many Functions", Hewlett-Packard Journal, May 1985, pp. 33–37; Ronald A. Askeland et al., "The Second-Generation Thermal InkJet Structure", Hewlett-Packard Journal, August 1988, pp. 28–31; and the aforementioned U.S. Pat. No. 5,167,776, "Thermal InkJet Printhead Orifice Plate and Method of Manufacture".

Since the reduced size printhead firing chamber and orifice bore diameter generate problems with conventional orifice plates such as overheating due to the large heater resistor necessitated by the thick orifice plate and increased susceptibility to particulate contamination in the orifice bore, it is desirable to reduce the thickness of the orifice plate. Since the orifice plate is best manufactured and used with thickness dimensions greater than 45 $\mu$m, it is desirable to produce printheads with orifice plates of this thickness or greater. This quandary needed to be solved to obtain low drop weight ink drops.

SUMMARY OF THE INVENTION

A printhead for an inkjet print cartridge is produced by depositing a metal film on a mandrel. The metal film is then removed from the mandrel and heat is applied to the metal film at a predetermined temperature for a predetermined time so that material properties are modified in the metal film. The metal film is then separated into sections suitable for an orifice plate. The sectioned metal plate is laminated to a barrier material and semiconductor substrate to form a printhead. The laminated printhead structure is then cured by applying heat to the printhead.

DETAILED DESCRIPTION OF THE PREFERRED EMBODIMENTS

Figure 1:
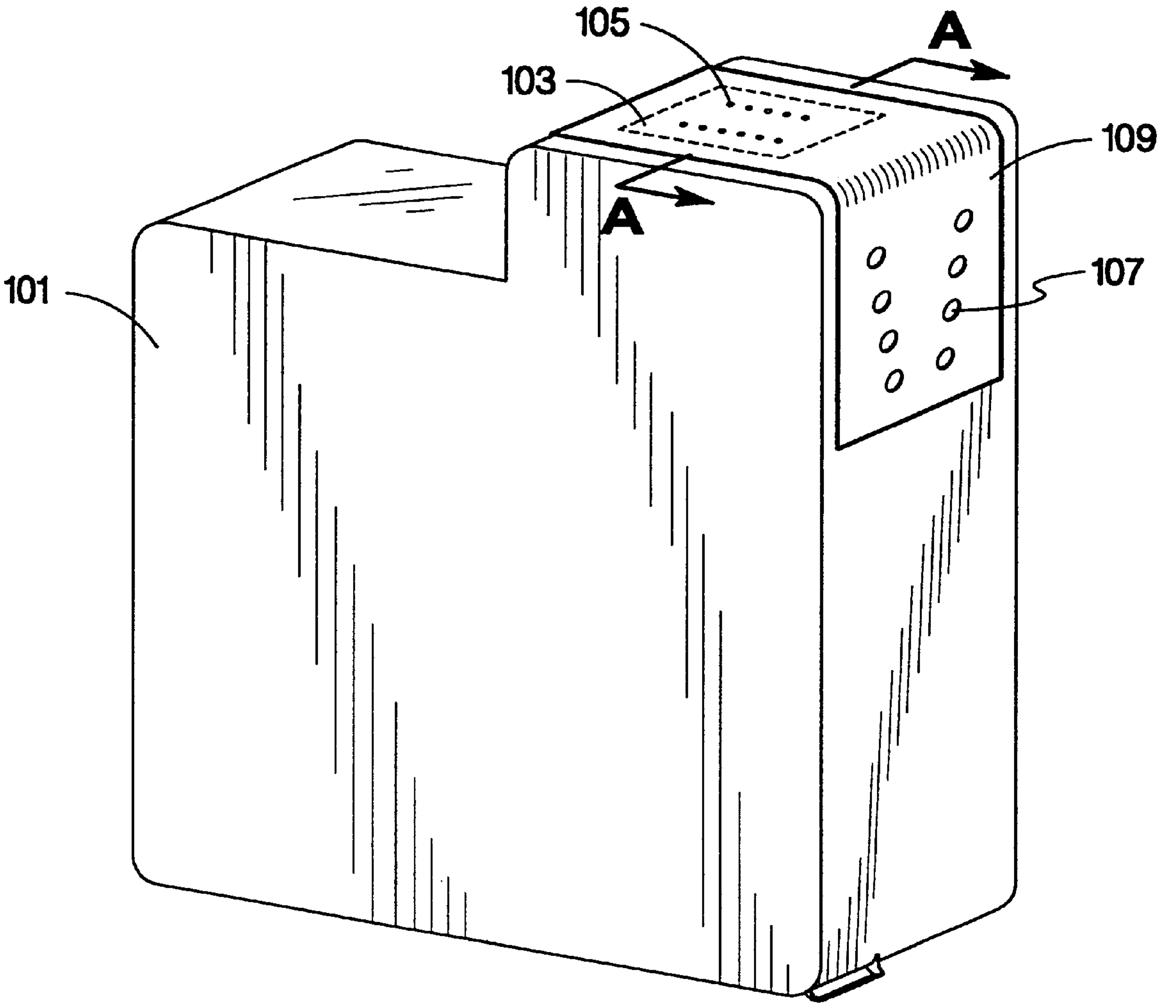
FIG. 1 is an isometric view of an inkjet printer printhead which may employ the present invention.

A typical inkjet cartridge is represented in the drawing of FIG. 1. A cartridge body member 101 houses a supply of ink and routes the ink to a printhead 103 via ink conduits. Visible at the outer surface of the printhead are a plurality of orifices, including orifice 105, through which ink is selectively expelled upon commands of the printer (not shown), which commands are communicated to the printhead 103 through electrical connections 107 and associated conductive traces (not shown) on a flexible polymer tape 109 which are, in turn, coupled to the metalization on the semiconductor substrate of the printhead. In a preferred embodiment of an inkjet print cartridge, the printhead is constructed from a semiconductor substrate, including thin film heater resistors disposed in the substrate, a photo definable barrier and adhesive layer, and a foraminous orifice plate which has a plurality of orifices extending entirely through the orifice plate as exemplified by the orifice 105. Physical and electrical connections from the substrate are made to the flexible polymer tape 109 by way of beam lead bonding or similar semiconductor technology and subsequently secured by an epoxy-like material for physical strength and fluid rejection. The polymer tape 109 may be formed of Kapton™, commercially available from 3M Corporation, or similar material which may be photoablated or chemically etched to produce openings and other desirable characteristics. Copper or other conductive traces are deposited or otherwise secured on one side of the tape so that electrical interconnections 107 can be contacted with the printer and routed to the substrate. The tape is typically bent around an edge of the print cartridge as shown and secured.

Figure 2:
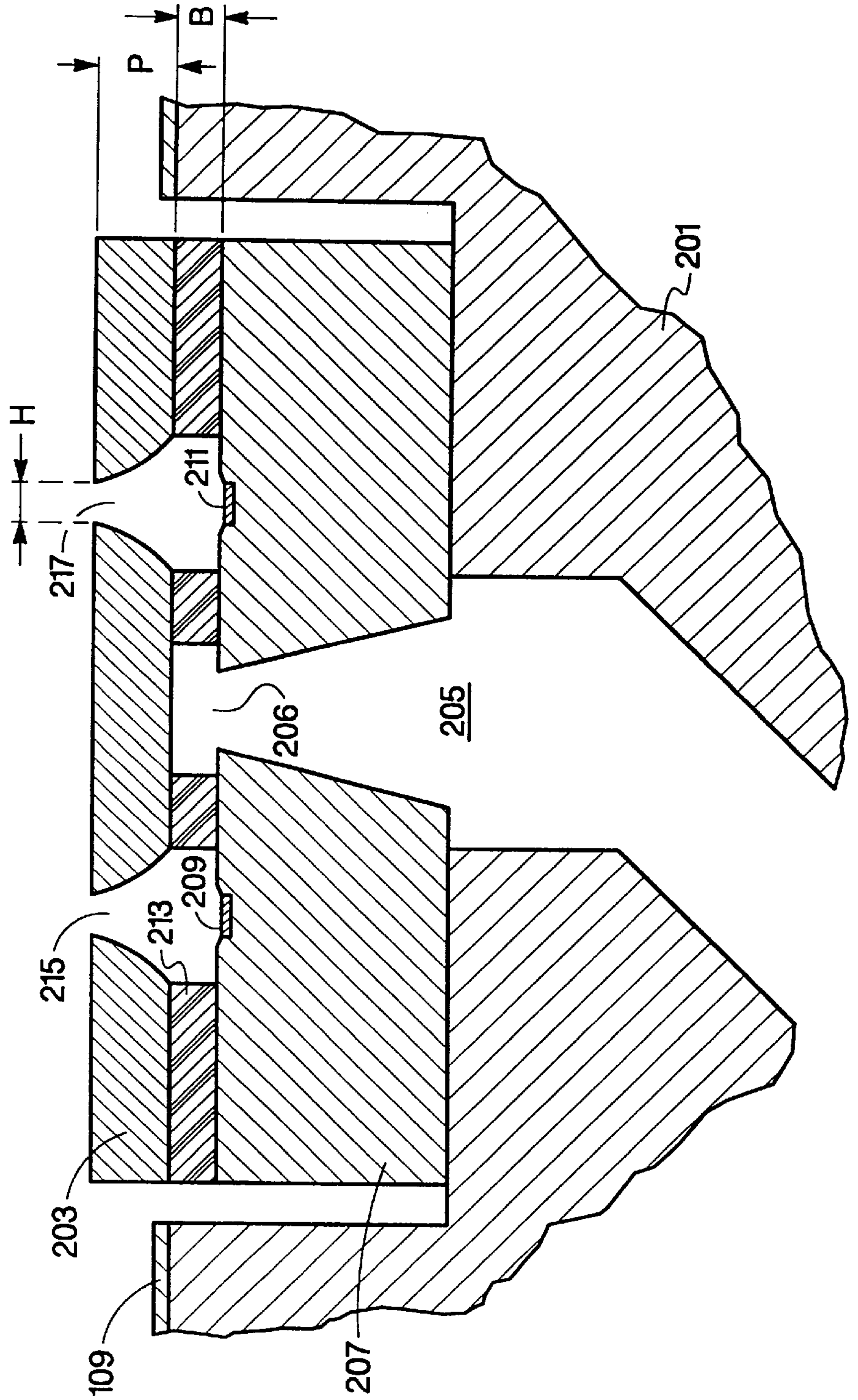
FIG. 2 is a portion of a cross section of the printhead of FIG. 1 taken across section line A—A.

A cross section of the printhead is shown in FIG. 2 and is taken from part of the section A—A shown in FIG. 1. A portion of the body 201 of the cartridge 101 is shown where it is secured to the printhead by an adhesive which is activated by pressure. In the preferred embodiment, ink is supplied to the printhead by way of a common ink plenum 205 and through a slot 206 in the printhead substrate 207. (Alternatively, the ink may be supplied along the sides of the substrate). Heater resistors and their associated orifices are conventionally arranged in two essentially parallel rows near the inlet of ink from the ink plenum. In many instances the heater resistors and orifices are arranged in a staggered configuration in each row and, in the preferred embodiment, the heater resistors are located on opposite sides of the slot 206 of the substrate 207, as exemplified by heater resistors 209 and 211 in FIG. 2.

A conventional orifice plate 203 is produced by electroforming nickel on a mandrel having insulating features with appropriate dimensions and suitable draft angles all in the form of a complement of the features desired in the orifice plate. Upon completion of a predetermined amount of time, and after a thickness of nickel has been deposited, the resultant nickel film is removed and treated for subsequent use. The nickel orifice plate is then coated with a precious metal such as gold, palladium, or rhodium to resist corrosion. Following its fabrication, the orifice plate is affixed to the semiconductor substrate 207 with a barrier layer 213. The orifices created by the electroforming of nickel on the mandrel extend from the outside surface of the orifice plate 203 through the material to the inside surface, the surface which forms one of the walls of the ink firing chamber. Usually, an orifice is aligned directly over the heater resistor so that ink may be expelled from the orifice without a trajectory error introduced by an offset.

The substrate 207 and orifice plate 203 are secured together by a barrier layer material 213 as previously mentioned. In the preferred embodiment, the barrier layer material 213 is disposed on the substrate 207 in a patterned formation such that firing chambers 215 and 217 are created in areas around the heater resistors. The barrier layer material is also patterned so that ink is supplied independently to the firing chambers 215, 217 by one or more ink feed channels in the barrier material. Ink drops are selectively ejected upon the rapid heating of a heater resistor 209 or 211 upon command by the printer. The substrate having the barrier layer affixed to one surface is thus positioned with respect to the orifice plate such that the orifices are aligned with the heater resistors of the substrate.

The barrier layer 213, in the preferred embodiment, utilizes a polymeric photodefinable material such as Parad™, Vacrel™, IJ5000, or other materials which are a film negative, photosensitive, multi-component, polymeric dry film which polymerizes with exposure to light or similar electromagnetic radiation. Materials of this type are available from E.I. DuPont de Nemoirs Company of Wilmington, Del. The barrier layer is first applied as a continuous layer upon the substrate 207 with the application of sufficient pressure and heat suitable for the particular material selected. The photolithographic layer is then exposed through a negative mask to ultraviolet light to polymerize the barrier layer material. The exposed barrier layer is then subjected to a chemical wash using a developer solvent so that the unexposed areas of the barrier layer are removed by chemical action. The remaining areas of barrier layer form the side walls of each ink firing chamber around each heater resistor. Also, the remaining areas of barrier layer form the walls of ink feed channels which lead from the ink firing chamber to a source of ink (such as the ink plenum 205 by way of the slot as shown in FIG. 2). These ink feed channels enable the initial fill of the ink firing chamber with ink and provide a continuous refill of the firing chamber after each expulsion of ink from the chamber.

Conventional orifice plates, which are approximately 8 mm long and 7 mm wide, are manufactured as an square film electroform having a side dimension of 12.7 cm (5 inches) and subsequently separated from the electroform by shearing each printhead apart from the electroform using conventional techniques pioneered by the semiconductor industry. Nickel is the metal of choice for a printhead because it is inexpensive, easy to electroform, and electroforms to intricate shapes. In particular, small holes can be conveniently created in the nickel orifice plate by electrically insulating small portions of the mandrel thereby preventing deposition of nickel on what is otherwise an electrically conducting cathodic electrode in a modified Watts-type mixed anion bath. Conventionally, a stainless steel mandrel is first laminated with a dry film positive photoresist. The photoresist is then exposed to ultraviolet light through a mask which, following development of the photoresist, creates features of insulation such as pads, pillars, and dikes which correspond to the orifices and other structures desired in the orifice plate. At the conclusion of a predetermined period of time related to the temperature and concentration of the plating bath, the magnitude of the DC current used for the plating current, and the thickness of the desired orifice plate, the mandrel and newly formed orifice plate electroform are removed from the plating bath, allowed to cool, and the orifice plate electroform is peeled from the mandrel. Since stainless steel has an oxide coating, plated metals only weakly adhere to the stainless steel and the electroformed metal orifice plate electroform can be easily removed without damage. The orifice plate electroform is then cut into the individual orifice plates. For a typical orifice plate, such as that used in an HP51649A inkjet print cartridge (commercially supplied by Hewlett-Packard Company), the orifice plate thickness is typically 51 $\mu$m with an orifice bore diameter of 35 $\mu$m to produce an ink drop with a drop weight of 50 ng. Another typical orifice plate, used in an HP51641A inkjet print cartridge (also commercially available from Hewlett-Packard Company), employs an orifice plate thickness of 51 $\mu$m with an orifice bore diameter of 27 $\mu$m to produce an ink drop having a drop weight of 32 ng.

The foregoing process, when used for orifice plate thicknesses less than 45 $\mu$m, could not produce an orifice plate which would withstand the rigors of handling in a production environment and creates problems in the final print cartridge such as printed drop placement errors due to various mechanical distortions of the thin orifice plate. Nevertheless, a printhead capable of delivering an ink drop having a drop weight of 10 ng has been developed to satisfy the need of finer resolution and improved print quality. In the preferred embodiment of the present invention, an orifice plate having a thickness of between 25 $\mu$m and 40 $\mu$m and a preferred thickness of 28 $\mu$m has been created. The orifice bore diameter of the preferred embodiment is 18 $\mu$m±2 $\mu$m.

Figure 3:
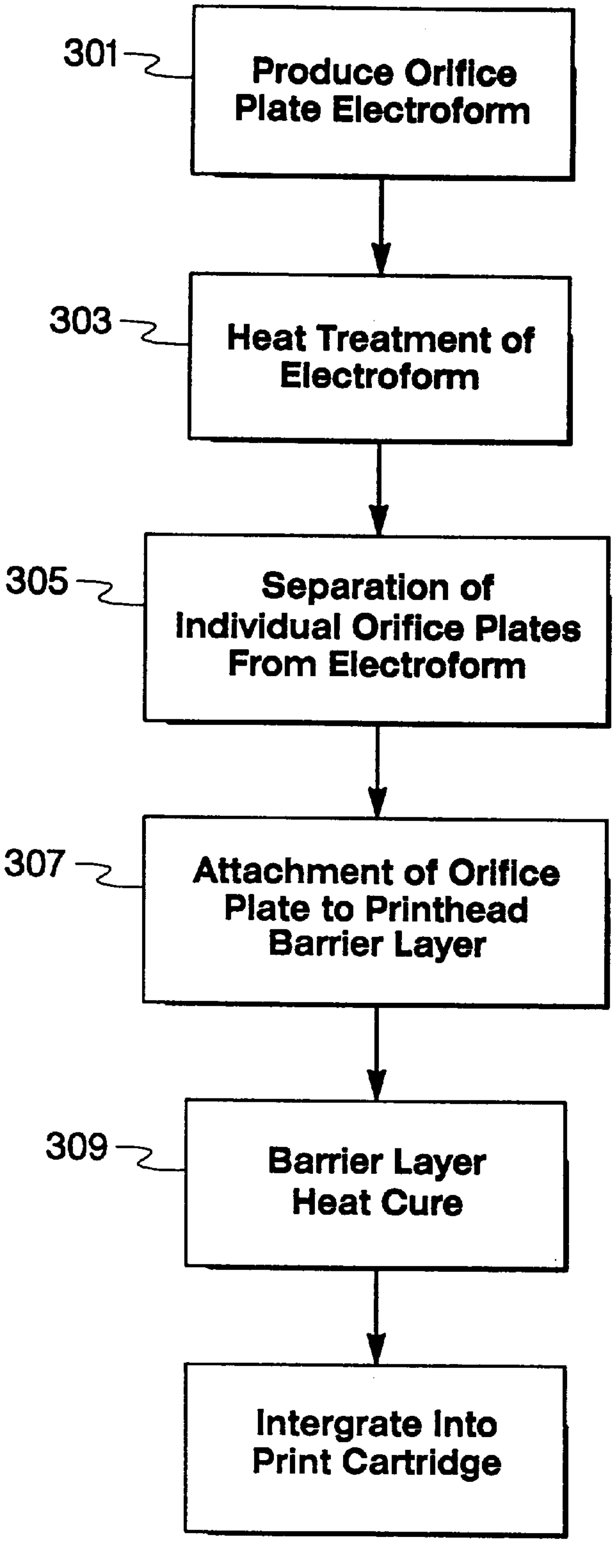
FIG. 3 is a simplified flowchart of a heat treatment process which may be employed in the present invention.

In order that such a thin orifice plate be realized and made practical in a production environment, an extended heat treatment and soft sintering step is included in the orifice plate manufacturing process, as shown in FIG. 3. In the preferred embodiment, a nickel orifice plate electroform is electroformed 301 using conventional processes but the metal deposition is stopped at the point where the nominal orifice plate thickness is 28 $\mu$m. The flimsy electroform is then subjected to a heat treatment/soft sintering step 303 which is described later herein. Following the heat treatment step, the electroform is sheared 305 into individual orifice plates and attached 307 to the barrier layer of the printhead as previously described. In order to cure the barrier layer and secure the semiconductor substrate and orifice plate into the laminate structure which comprises the printhead, a heat cure step 309 is utilized. Attachment of orifice plate to the barrier layer is accomplished with the application of heat (approximately 200° C.) and pressure (between 50 and 250 psi.) for a period of time up to 15 minutes. Adhesion promoters, such as those disclosed in the U.S. patent application Ser. No. 08/742,118, filed on behalf of Garold Radke et al. On Oct. 1, 1996, may be employed to enhance the bond between the orifice plate and barrier layer. A final set-up of the polymer and cure of the bond is then accomplished with a thermal soak at approximately 220° C. for approximately 30 minutes. Following the heat cure step, the completed printhead is integrated into the inkjet print cartridge.

Since the sandwich of semiconductor substrate, barrier layer, and orifice plate is assembled under temperature and pressure and subsequently heat cured and, in view of the fact that there is a mismatch in the coefficients of thermal expansion of the components of the sandwich, the assembly develops residual stresses as it cools. Results of these stresses often take the form of distorted orifice plates and delamination of orifice plate, barrier layer material, and substrate. Thinner orifice plates experience greater distortion thereby creating a serious problem in dot placement and overall print quality.

There are three distinct regimes of behavior of the orifice plate sheets as they are subjected to temperature and time. First, from ambient to about 200° C. there is a very linear amount of shrinkage of the orifice plate vs temperature. At 200° C. to 230° C., hardness increases and serious embrittlement of the orifice plate takes place. Above 230° C., the slope of shrink vs temperature again changes, and hardness decreases rapidly with temperature, as would be expected if the material were annealing In the first regime (to 200° C.), various compounds that are trapped and/or dissolved by the nickel as it is electroplated are evolved from the electroform. From x-ray crystallography it has been determined that little grain growth takes place in this temperature range. In the second regime, it appears that the material is sintering. Some annealing is probably also taking place because of the drop in hardness of material left in at 200° C. for additional time. One possible explanation for this behavior is a densification of the orifice plated during annealing coupled with the grain growth. The density increases as the orifice plates are annealed. The increase in density initially results in an increase in hardness while the grain size remains constant. However, when grain growth occurs, the chance that a dislocation will be trapped by a grain boundary decreases and so the hardness decreases. Above 230° C., the material is clearly annealing, though embrittlement is still an issue in the times and temperatures tested. At temperatures at or exceeding 300° C., discoloration of the orifice plate is noticed.

Figure 4:
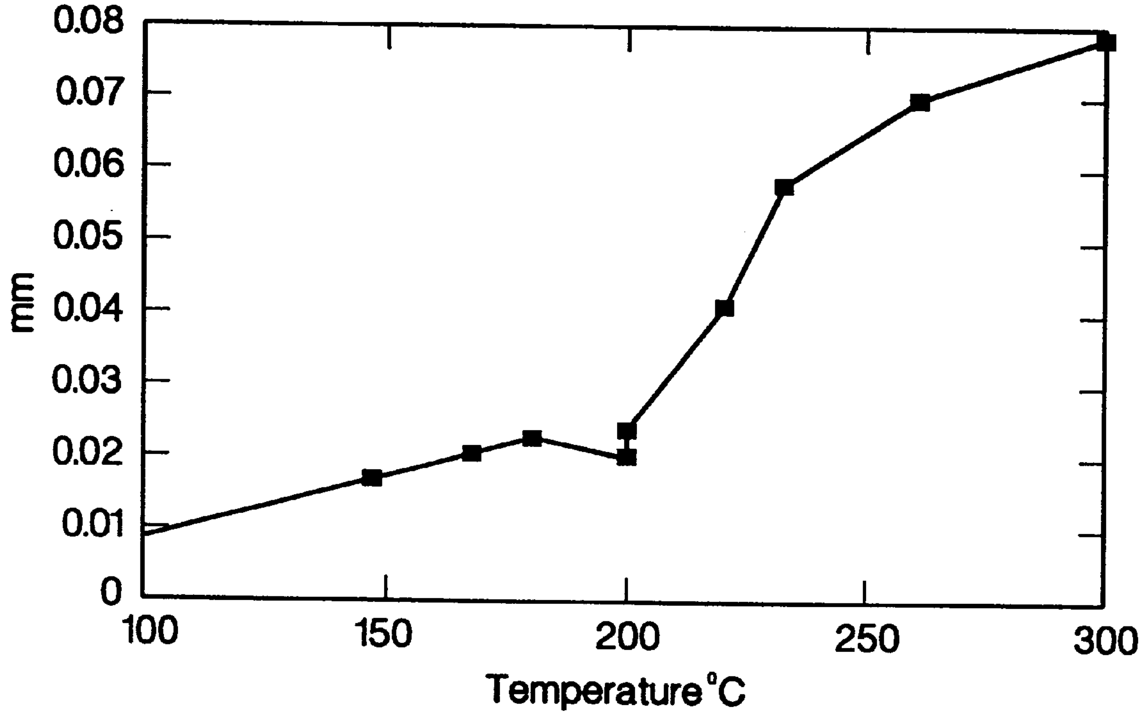
FIG. 4 is a graph showing the amount of orifice plate material shrinkage at various temperatures.
Figure 5:
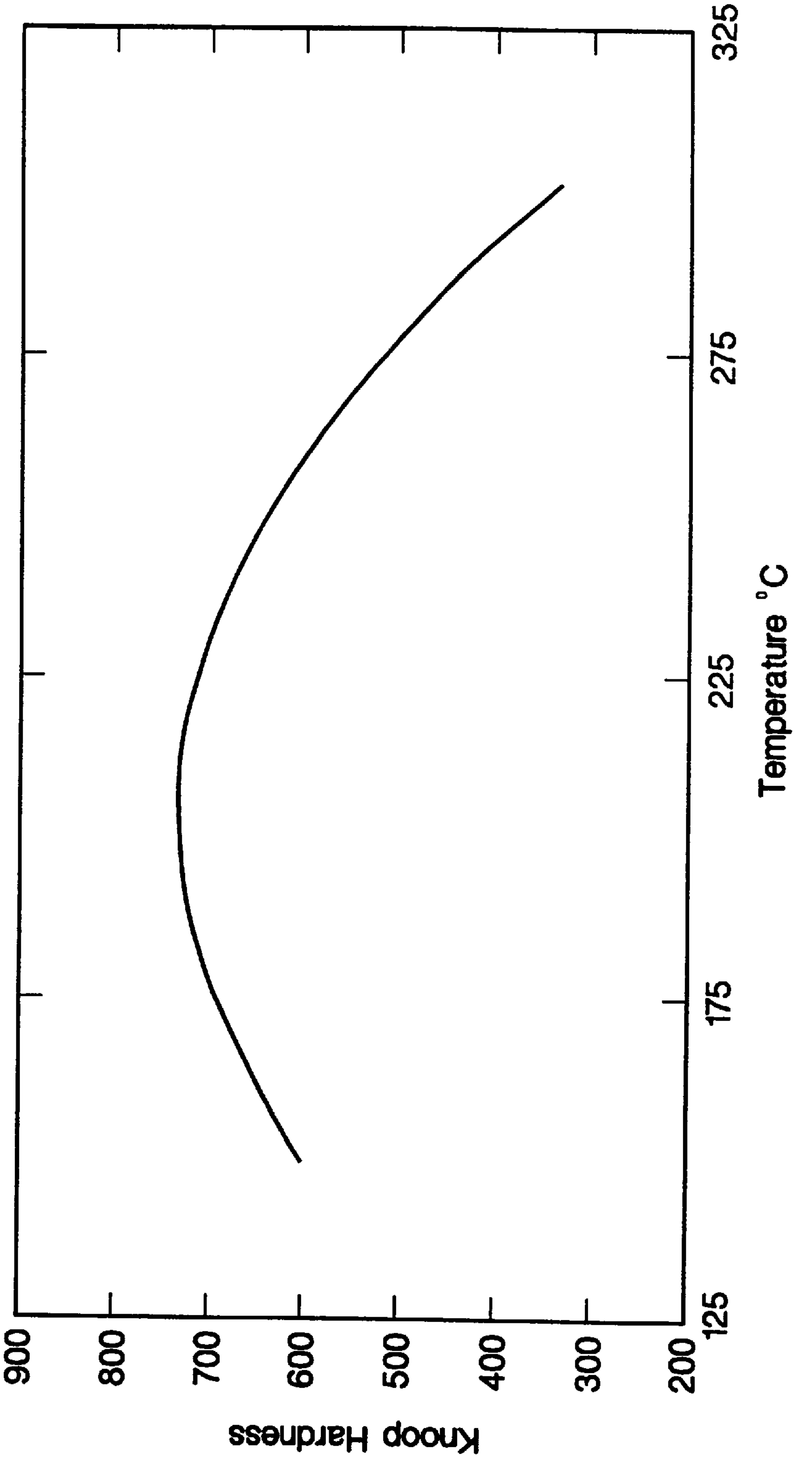
FIG. 5 is a graph of the Knoop hardness of an orifice plate at various temperatures.
Figure 6:
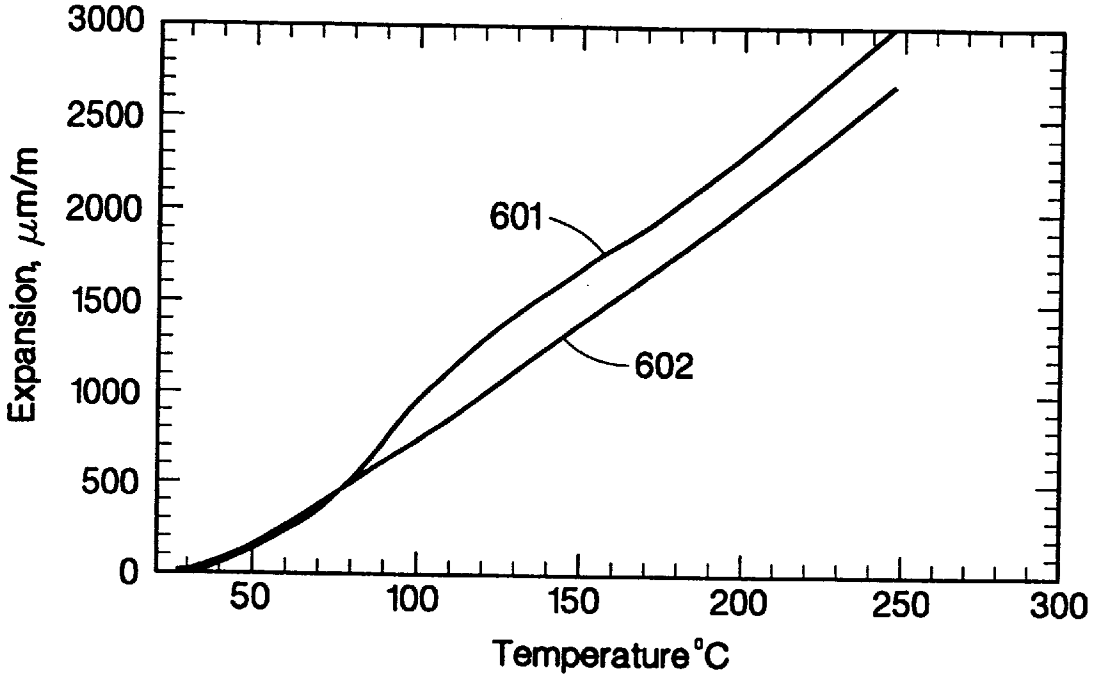
FIG. 6 is a graph of thermal expansion of a nickel orifice plate illustrating the effect of a heat treatment step which may be employed in the present invention.

In the preferred embodiment, fiducials are placed on the orifice plate electroforms. Shrinkage of the nickel orifice electroform was measured by measuring the distance between fiducials before and after heat treatment. The magnitude of shrinkage is plotted in FIG. 4 for various temperatures of heat treatment. Additionally, the orifice plate electroforms were tested for Knoop hardness and the variation in hardness resulting from the different temperatures of heat treatment are plotted in FIG. 5. The improvement in linearity and magnitude of thermal expansion after heat treatment is shown in FIG. 6, in which curve 601 shows the thermal expansion of a nickel orifice plate without heat treatment as the orifice plate is heated to 250° C. at a 5° C./min ramp. Curve 602 shows the thermal expansion of the nickel orifice plate after heat treatment, using the same 5° C./min thermal ramp. Clearly, curve 602 does not show nonlinear behavior and the calculated coefficient of thermal expansion lies in the range very close to that of pure nickel (13 $\mu$m/m*° C.). Thus thermal treatment (annealing) of nickel orifice plates diminishes mismatch of its coefficient of thermal expansion with that of a semiconductor substrate (coefficient of thermal expansion of silicon is ~3.0 μm/m*° C.) and results in a reduction of warpage after the orifice plate attachment. The mechanism of the coefficient of thermal expansion reduction is most likely caused by partial recrystallization and relieving of internal stresses in the nickel orifice plate crystalline structure.

X-ray diffraction was used to investigate the microstructural changes that occur in a nickel orifice plate during annealing in air at various temperatures in order to better understand the process which included a thermal soak and soft sintering step. The samples tested were singulated orifice plates consisting of a nickel electroform electroplated with 1.5 μm of Palladium on each side. The samples analyzed included non-thermal soaked orifice plates as well as orifice plates annealed at 200, 300, 400 and 500° C. for 30 minutes in air.

Figure 7:
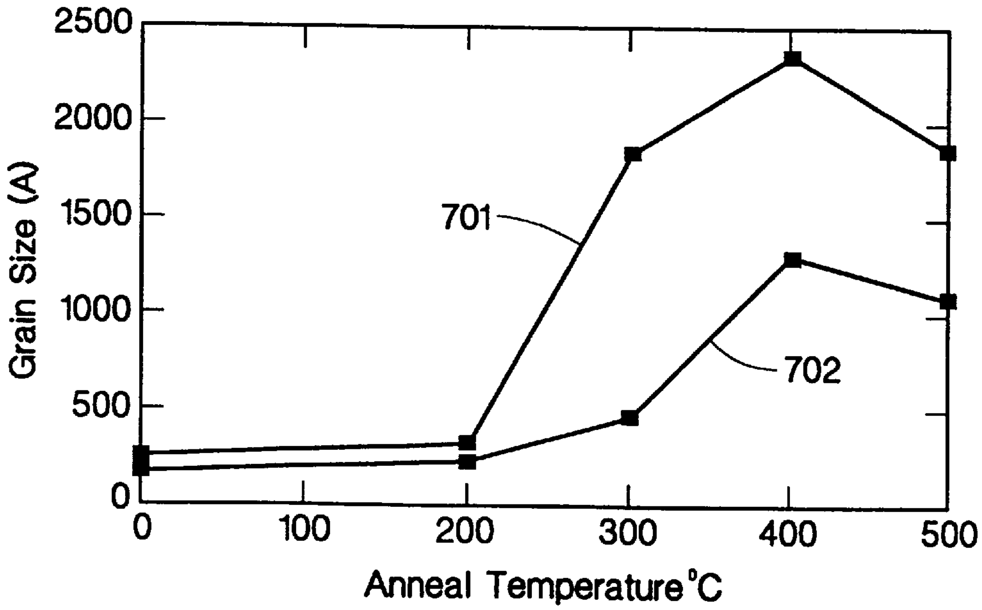
FIG. 7 is a graph illustrating the estimated grain size of an orifice plate at various temperatures of annealing.

Samples were placed on a 'zero background' (non-diffracting) single crystal silicon substrate and data were taken with a diffractometer using Cu-Kα radiation from 38 to 105 degrees (2-theta). X-ray diffraction data from the as-received orifice and the orifice plates annealed at 200, 400, and 500° C. show that all expected face centered cubic nickel (fcc-Ni) and fcc-Paladium reflections were observed for all samples. Using Braggs' law and assuming fcc materials, the lattice parameters associated with the observed reflections were calculated. The observed lattice parameters are close to those quoted for fcc-Ni and Pd by Cullity: 3.5239 and 3.8908 Å, respectively. Using the Scherrer formula, an estimate of the particle size at each temperature can be made for the nickel (curve 701) orifice plate and palladium (curve 702) plating as is shown in FIG. 7. The grain size does not change noticeably until the annealing temperature is above 200 C. The electroplated grain size is estimated to be approximately 200 Å for both nickel and palladium prior to annealing. Thus electroformed nickel orifice plates plated with a palladium protective layer are comprised of fcc-Ni and fcc-Pd with a grain size of approximately 200 Å. Annealing temperatures below 200° C. do not result in major microstructural changes to the orifice plate, but do increase hardness likely due to densification of the electroformed parts. Annealing at temperatures above 300° C. also results in the probable formation of a Ni/Pd solid solution and discoloration of the orifice plate likely due to oxidation of one or both of the available metals. In the preferred embodiment an annealing heat treatment step for the orifice plate electroform lasting for greater than 15 minutes and preferably 30 minutes at 220° C. yields an orifice plate electroform with increased hardness and rigidity which enables the manufacture of orifice plates having thicknesses between 25 μm and 40 μm. In the preferred embodiment, the orifice plate is manufactured with a nominal thickness of 28 μm. Further, orifice plates which experience such an annealing step have reduced distortions resulting from the process of affixing the orifice plate to the barrier material and subsequent curing of the laminated printhead.

In the preferred embodiment, the dimensions of many of the elements of the printhead have been made significantly smaller than previously known designs to produce a high quality of ink printing by using small ink drops. The nominal ink drop weight is approximately 10 ng for ejection from an orifice having a bore diameter of H=18 μm (±2 μm) as shown in FIG. 2. In order to achieve an ink firing chamber refill rate supportive of a 15 KHz frequency of operation, two ink feed channels are employed to provide redundant ink refill capability. The orifice plate 203 has a thickness, P, of 28 μm±1.5 μm and the barrier layer has a thickness, B, of 14 μm±1.5 μm.

Thus a printhead having reduced dimensions and a thin orifice plate has been produced which overcame the problems previously encountered with small dimension printheads and orifice plate thicknesses less than 45 μm.

We claim:

1. A method of manufacturing a printhead for an inkjet print cartridge, comprising the steps of:

depositing a metal film on a mandrel;

separating said metal film from said mandrel;

applying heat and raising said metal film to a temperature of at least 200° C. for a predetermined time for annealing said metal film;

laminating said separated metal film to a barrier material and semiconductor substrate to form a printhead using an adhesive barrier layer; and applying heat to said printhead such that said printhead adhesive barrier layer is cured.

2. A method in accordance with the method of claim 1 wherein said step of applying heat to said metal film further comprises the steps of:

raising said metal film to a temperature between 200° C. and 230° C.; and maintaining said temperature for a period of time not less than 15 minutes.

3. A method in accordance with the method of claim 1 wherein said step of separating said metal film further comprises the step of shearing said metal film.

4. A printhead manufactured in accordance with the method of claim 1.

* * * * *